United States Patent
Jeong et al.

(10) Patent No.: US 10,445,010 B2
(45) Date of Patent: Oct. 15, 2019

(54) NONVOLATILE MEMORY DEVICE AND METHOD OF THROTTLING TEMPERATURE OF NONVOLATILE MEMORY DEVICE

(71) Applicants: Sung-Won Jeong, Suwon-si (KR); Hee-Woong Kang, Suwon-si (KR)

(72) Inventors: Sung-Won Jeong, Suwon-si (KR); Hee-Woong Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 126 days.

(21) Appl. No.: 15/440,680

(22) Filed: Feb. 23, 2017

(65) Prior Publication Data
US 2018/0067678 A1 Mar. 8, 2018

(30) Foreign Application Priority Data
Sep. 5, 2016 (KR) ........................ 10-2016-0114014

(51) Int. Cl.
*G06F 11/14* (2006.01)
*G06F 12/08* (2016.01)
*G06F 12/0808* (2016.01)
*G06F 12/0815* (2016.01)
*G06F 3/06* (2006.01)
(Continued)

(52) U.S. Cl.
CPC ............ *G06F 3/0634* (2013.01); *G06F 1/206* (2013.01); *G06F 3/064* (2013.01); *G06F 3/0616* (2013.01); *G06F 3/0679* (2013.01); *G06F 12/0246* (2013.01); *G06F 12/0253* (2013.01); *G11C 7/04* (2013.01); *G11C 16/349* (2013.01);
(Continued)

(58) Field of Classification Search
CPC ... G06F 3/0634; G06F 3/0679; G06F 12/0253
USPC ........................................................ 711/154
See application file for complete search history.

(56) References Cited

U.S. PATENT DOCUMENTS 7,679,133 B2   3/2010  Son et al.
8,081,531 B2  12/2011  Lee
(Continued)

FOREIGN PATENT DOCUMENTS

JP        06084391       3/1994
JP     2009/170605 A    7/2009
(Continued)

*Primary Examiner* — Mohamed M Gebril
(74) *Attorney, Agent, or Firm* — Harness, Dickey & Pierce, P.L.C.

(57) ABSTRACT

In a method of throttling temperature of a nonvolatile memory device including a memory cell array, a current temperature of the nonvolatile memory device may be detected periodically. The current temperature may be compared with a reference temperature. Whether an external input/output command, which is provided by a memory controller, exists may be determined when the current temperature is lower than the reference temperature. An input/output operation, which corresponds to the external input/output command, may be performed on the memory cell array when the external input/output command exists. A desired and/or alternatively predetermined internal input/output operation may be performed on the memory cell array regardless of a command from the memory controller when the external input/output command does not exist.

17 Claims, 12 Drawing Sheets

(51) Int. Cl.
  G06F 12/02 (2006.01)
  G06F 1/20 (2006.01)
  G11C 7/04 (2006.01)
  G11C 16/34 (2006.01)
  *G11C 7/10* (2006.01)
  *G11C 7/22* (2006.01)

(52) U.S. Cl.
  CPC ...... *G06F 2212/7205* (2013.01); *G11C 7/109* (2013.01); *G11C 7/222* (2013.01)

(56) References Cited

U.S. PATENT DOCUMENTS

| | | | |
|---|---|---|---|
| 8,446,792 B2 * | 5/2013 | Fukushima | G01R 31/2874 365/154 |
| 8,533,384 B2 * | 9/2013 | Olbrich | G06F 13/1657 711/103 |
| 8,553,466 B2 | 10/2013 | Han et al. | |
| 8,559,235 B2 | 10/2013 | Yoon et al. | |
| 8,599,622 B2 | 12/2013 | Kim et al. | |
| 8,612,677 B1 | 12/2013 | Motegi | |
| 8,654,587 B2 | 2/2014 | Yoon et al. | |
| 9,077,839 B2 | 7/2015 | Kambegawa | |
| 9,442,843 B2 * | 9/2016 | Nakashita | G06F 12/0246 |
| 2007/0216376 A1 * | 9/2007 | Ogawa | G01K 3/005 323/236 |
| 2007/0274147 A1 * | 11/2007 | Egerer | G11C 11/406 365/222 |
| 2011/0167208 A1 * | 7/2011 | So | G06F 12/0246 711/103 |
| 2011/0233648 A1 | 9/2011 | Seol et al. | |
| 2014/0359242 A1 * | 12/2014 | Son | G06F 13/1689 711/167 |
| 2015/0143026 A1 * | 5/2015 | Reddy | G06F 3/0616 711/103 |
| 2015/0301932 A1 * | 10/2015 | Oh | G06F 11/00 711/102 |
| 2016/0066266 A1 * | 3/2016 | Law | H04W 52/027 455/574 |
| 2017/0071056 A1 * | 3/2017 | Stoev | H05K 1/0212 |
| 2017/0249091 A1 * | 8/2017 | Hodes | G06F 3/0611 |
| 2018/0067678 A1 * | 3/2018 | Jeong | G06F 3/0616 |

FOREIGN PATENT DOCUMENTS

JP   2010/191896 A   9/2010
KR   10-1058079 B   8/2011

* cited by examiner

NONVOLATILE MEMORY DEVICE AND
METHOD OF THROTTLING
TEMPERATURE OF NONVOLATILE
MEMORY DEVICE

CROSS-REFERENCE TO RELATED
APPLICATION(S)

This application claims priority under 35 USC § 119 to Korean Patent Application No. 10-2016-0114014, filed on Sep. 5, 2016 in the Korean Intellectual Property Office (KIPO), the contents of which are herein incorporated by reference in their entirety.

BACKGROUND

1. Technical Field

Example embodiments relate to a nonvolatile memory device, and more particularly to a method of throttling temperature of a nonvolatile memory device.

2. Description of Related Art

Semiconductor memory devices may be classified into volatile semiconductor memory devices and nonvolatile semiconductor memory devices. Volatile semiconductor memory devices may perform read and write operations at high speed, while contents stored therein may be lost when the devices are powered-off. Nonvolatile semiconductor memory devices may retain contents stored therein even when powered-off. For this reason, nonvolatile semiconductor memory devices may be used to store contents to be retained regardless of whether the devices are powered on or off.

A flash memory device may be a typical nonvolatile memory device. A flash memory device may be widely used as the voice and image storing media of electronic apparatuses such as a computer, a cellular phone, a PDA, a digital camera, a camcorder, a voice recorder, an MP3 player, a handheld PC, a game machine, a facsimile, a scanner, a printer, etc.

Generally, when a temperature of a nonvolatile memory device is low, resistances of memory cells increase such that a possibility of a data corruption of the memory cells increases.

Therefore, an operation error of a nonvolatile memory device may occur at an initial stage of turning on of the nonvolatile memory device while a temperature of the nonvolatile memory device is low.

SUMMARY

Some example embodiments relate to a method of throttling temperature of a nonvolatile memory device that effectively increases the temperature of the nonvolatile memory device when the temperature of the nonvolatile memory device is low.

Some example embodiments relate to a nonvolatile memory device that effectively increases a temperature of the nonvolatile memory device when the temperature of the nonvolatile memory device is low.

According to some example embodiments, a method of throttling temperature of a nonvolatile memory device including a memory cell array is provided. The method includes detecting a current temperature of the nonvolatile memory device periodically; determining whether an external input/output command, which is provided by a memory controller, exists when the current temperature is lower than a reference temperature; performing an input/output operation, which corresponds to the external input/output command, on the memory cell array when the external input/output command exists and the current temperature is lower than the reference temperature; and performing an internal input/output operation on the memory cell array regardless of a command from the memory controller when the external input/output command does not exist and the current temperature is lower than the reference temperature.

According to some example embodiments, a nonvolatile memory device includes a memory cell array, a temperature sensor, and a control circuit. The memory cell array includes a plurality of memory cells. The temperature sensor is configured to detect a current temperature of the memory cell array. The control circuit is configured to determine whether an external input/output command, which is provided by a memory controller, exists when the current temperature is lower than a reference temperature. When the external input/output command exists and the current temperature is lower than the reference temperature, the control circuit performs an input/output operation, which corresponds to the external input/output command, on the memory cell array. When the external input/output command does not exist and the current temperature is lower than the reference temperature, the control circuit performs an internal input/output operation on the memory cell array regardless of a command from the memory controller.

According to some example embodiments, a method of throttling temperature of a nonvolatile memory device including a memory cell array is provided. The method includes detecting a current temperature of the nonvolatile memory device; determining whether a memory controller provided an external input/output command to the nonvolatile memory device when the current temperature is lower than or equal to a reference temperature; performing an input/output operation of a first type on the nonvolatile memory device if the current temperature is lower than or equal to the reference temperature and the memory controller provided the external input/output command to the nonvolatile memory device when the current temperature is lower than or equal to the reference temperature, where the input/output operation of the first type is performed on the nonvolatile memory device in response to the external input/output command provided by the memory controller; performing an input/output operation of a second type on the nonvolatile memory device if the current temperature is lower than or equal to the reference temperature and the memory controller does not provide the external input/output command to the nonvolatile memory device when the current temperature is lower than or equal to the reference temperature. The input/output operation of the second type may be performed on the nonvolatile memory device regardless of a command from the memory controller. The input/output operation of the second type may be different than the input/output operation of the first type.

According to some example embodiments, a nonvolatile memory device includes a memory cell array, a temperature sensor, and a control circuit. The memory cell array includes a plurality of memory cells. The temperature sensor is configured to detect a current temperature of the memory cell array. The control circuit is configured to determine a memory controller provided an external input/output command to the memory cell array when the current temperature is lower than or equal to a reference temperature. When the external input/output command was provided to the memory cell array and the current temperature is lower than or equal to the reference temperature, the control circuit performs an input/output operation of a first type on the memory cell array in response to the external input/output command. When the external input/output command does not exist and the current temperature is lower than or equal to the reference temperature, the control circuit performs an internal input/output operation of a second type on the memory cell array regardless of a command from the memory controller. The input/output operation of the second type is different than the input/output operation of the first type.

BRIEF DESCRIPTION OF THE DRAWINGS

Illustrative, non-limiting example embodiments will be more clearly understood from the following detailed description in conjunction with the accompanying drawings.

DETAILED DESCRIPTION

Figure 1:
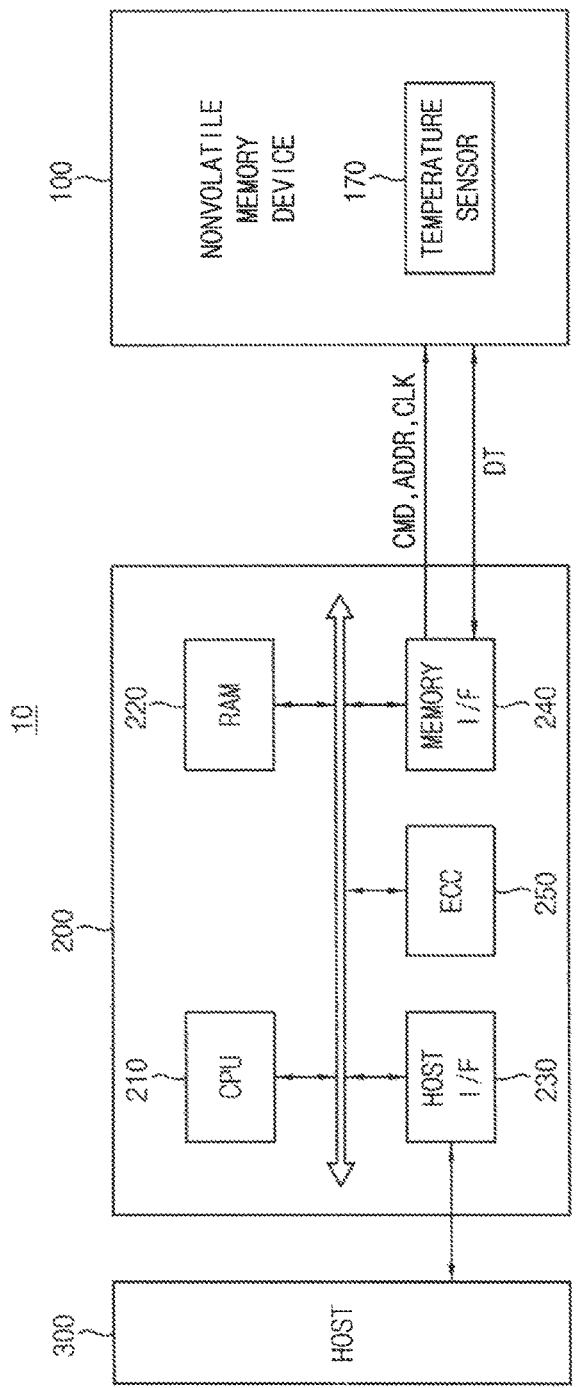
FIG. 1 is a block diagram illustrating an electronic system according to some example embodiments.

FIG. 1 is a block diagram illustrating an electronic system according to some example embodiments.

Referring to FIG. 1, an electronic system 10 includes a nonvolatile memory device 100, a memory controller 200, and a host 300.

The memory controller 200 controls an operation of the nonvolatile memory device 100. The memory controller 200 may control a data transfer between the host 300 and the nonvolatile memory device 100.

The memory controller 200 may include a central processing unit CPU 210, a buffer memory 220 (e.g., RAM), a host interface 230, and a memory interface 240.

The central processing unit 210 may perform operations for the data transfer.

The buffer memory 220 may be implemented by a dynamic random access memory (DRAM), a static random access memory (SRAM), a phase change random access memory (PRAM), a ferroelectric random access memory (FRAM), a resistance random access memory (RRAM), a magnetic random access memory (MRAM), etc.

The buffer memory 220 may be an operational memory of the central processing unit 210. In some example embodiments, the buffer memory 220 may be included in the memory controller 200. In other example embodiments, the buffer memory 220 may be outside of the memory controller 200.

The host interface 230 may be coupled to the host 300, and the memory interface 240 may be coupled to the nonvolatile memory device 100.

The central processing unit 210 may communicate with the host 300 via the host interface 230. For example, the host interface 230 may be configured to communicate with the host 300 using at least one of various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), and so on.

Further, the central processing unit 210 may communicate with the nonvolatile memory device 100 via the memory interface 240.

In some example embodiments, the memory controller 200 may further include an error correction block ECC 250 for an error correction.

The central processing unit 210 may receive data from the host 300 through the host interface 230, and program the data on the nonvolatile memory device 100 through the memory interface 240.

For example, the central processing unit 210 may provide a command signal CMD, an address signal ADDR, a clock signal CLK, and data DT to the nonvolatile memory device 100 through the memory interface 240, and the nonvolatile memory device 100 may program the data DT on memory cells based on the command signal CMD, the address signal ADDR, and the clock signal CLK.

In addition, the central processing unit 210 may read data from the nonvolatile memory device 100 through the memory interface 240, and provide the data to the host 300 through the host interface 230.

For example, the central processing unit 210 may provide a command signal CMD, an address signal ADDR, and a clock signal CLK to the nonvolatile memory device 100 through the memory interface 240, and the nonvolatile memory device 100 may read data DT from memory cells based on the command signal CMD, the address signal ADDR, and the clock signal CLK and provide the data DT to the memory controller 200.

As illustrated in FIG. 1, the nonvolatile memory device 100 may include a temperature sensor 170.

Generally, when a temperature of a memory cell array included in the nonvolatile memory device 100 is low, resistances of memory cells included in the memory cell array may increase such that an operation error of the nonvolatile memory device 100 may occur.

As will be described later, the nonvolatile memory device 100 may periodically detect a current temperature using the temperature sensor 170, and perform an input/output operation, which corresponds to a command received from the memory controller 200, or a predetermined internal input/output operation when the current temperature is lower than a reference temperature.

Therefore, when the current temperature is lower than the reference temperature, the nonvolatile memory device 100 according to some example embodiments may rapidly increase the temperature of the memory cell array above the reference temperature to limit and/or prevent the operation error.

Figure 2:
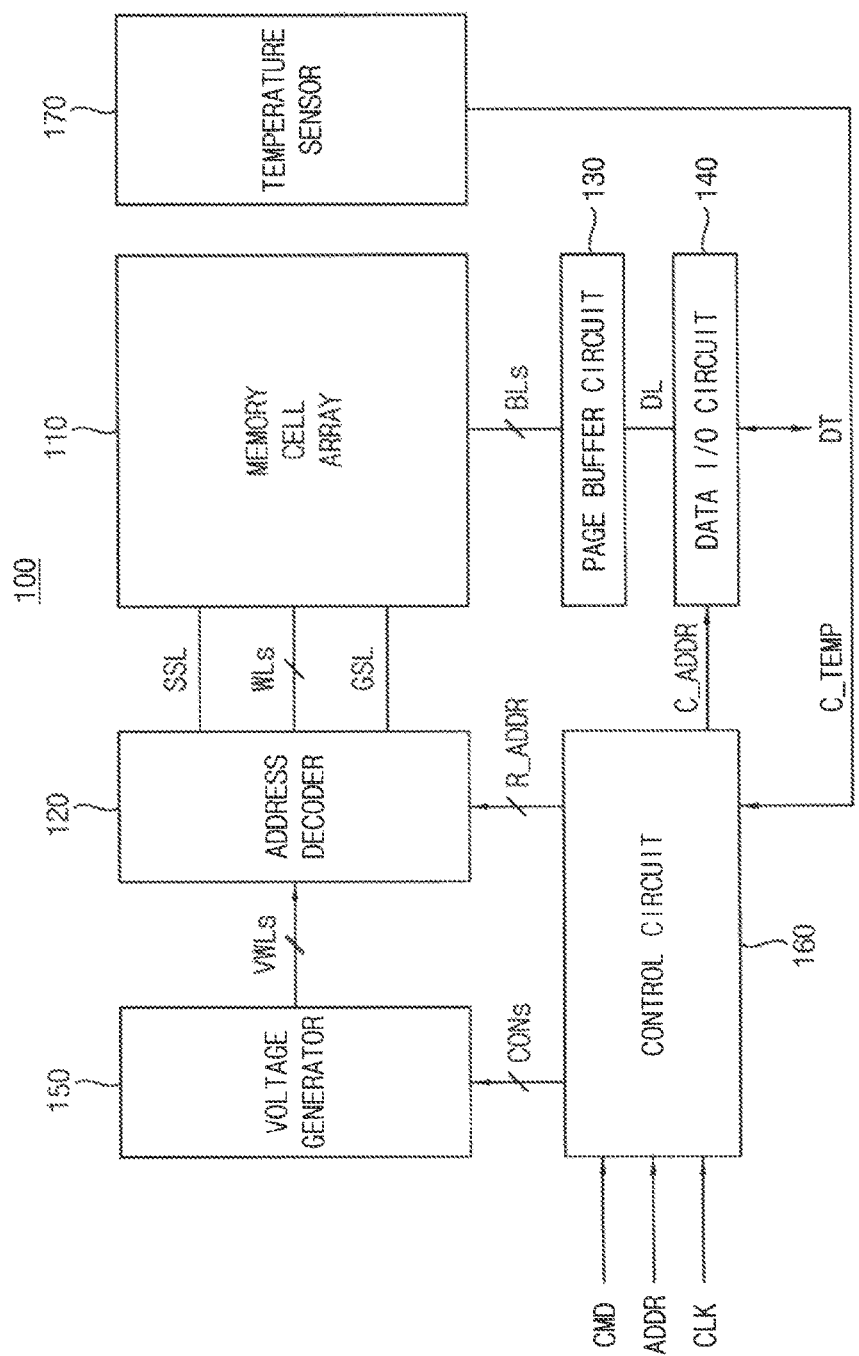
FIG. 2 is a block diagram illustrating an example of a nonvolatile memory device included in the electronic system of FIG. 1.

FIG. 2 is a block diagram illustrating an example of a nonvolatile memory device included in the electronic system of FIG. 1.

Referring to FIG. 2, the nonvolatile memory device 100 may include a memory cell array 110, an address decoder 120, a page buffer circuit 130, a data input/output circuit 140, a voltage generator 150, a control circuit 160, and a temperature sensor 170.

The memory cell array 110 may be coupled to the address decoder 120 through a string selection line SSL, a plurality of word lines WLs, and a ground selection line GSL. In addition, the memory cell array 110 may be coupled to the page buffer circuit 130 through a plurality of bit lines BLs.

The memory cell array 110 may include a plurality of memory cells coupled to the plurality of word lines WLs and the plurality of bit lines BLs.

In some example embodiments, the memory cell array 110 may be a three-dimensional memory cell array, which is formed on a substrate in a three-dimensional structure (or a vertical structure). In this case, the memory cell array 110 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

In other example embodiments, the memory cell array 110 may be a two-dimensional memory cell array, which is formed on a substrate in a two-dimensional structure (or a horizontal structure).

Figure 3:
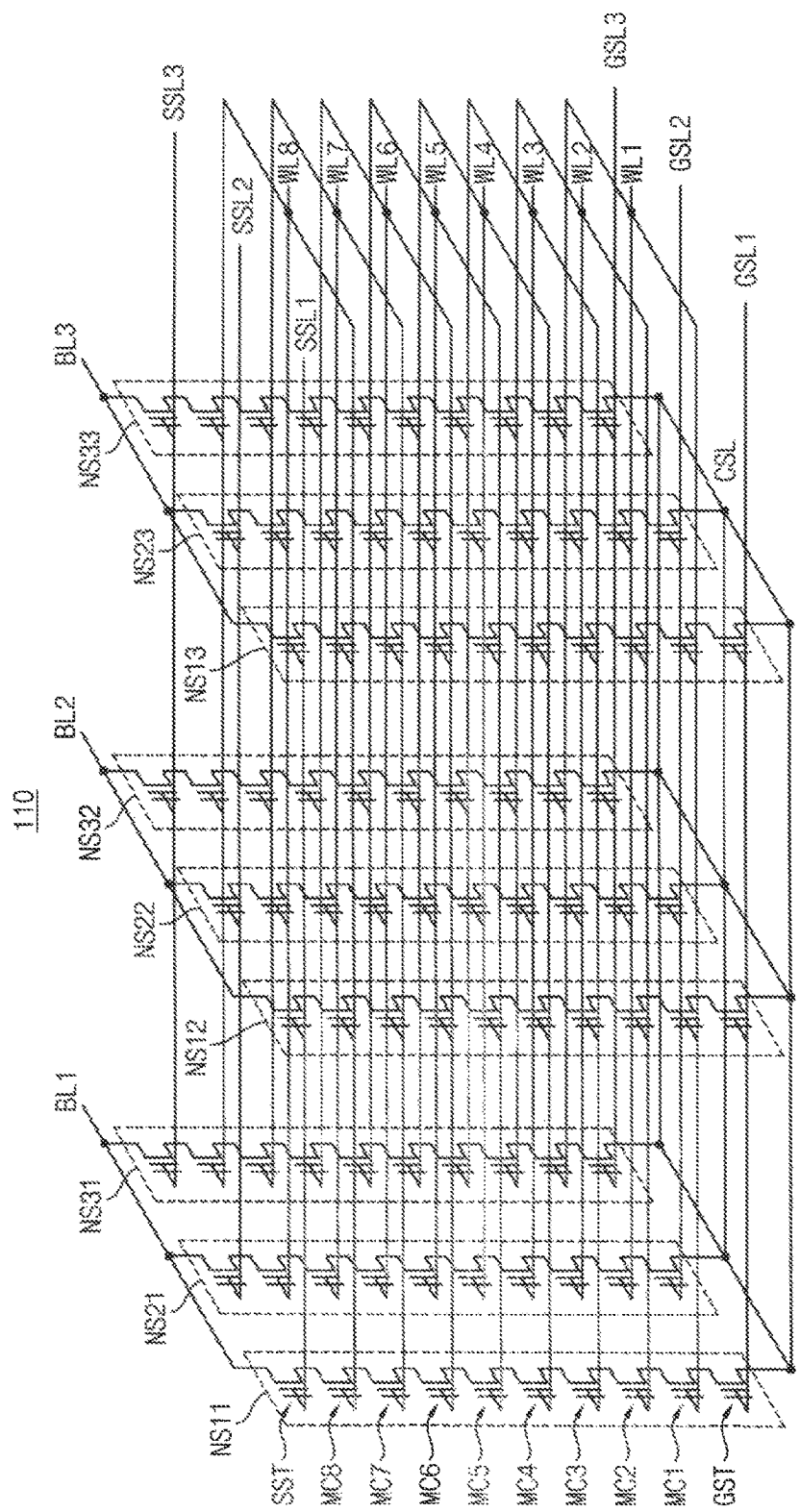
FIG. 3 is a circuit diagram illustrating an example of a memory cell array included in the nonvolatile memory device of FIG. 2.

FIG. 3 is a circuit diagram illustrating an example of a memory cell array included in the nonvolatile memory device of FIG. 2.

A memory cell array 110 of FIG. 3 may be formed on a substrate in a three-dimensional structure (or a vertical structure). For example, a plurality of memory cell strings included in the memory cell array 110 may be formed in a direction perpendicular to the substrate.

Referring to FIG. 3, the memory cell array 110 may include memory cell strings NS11 to NS33 coupled between bit lines BL1, BL2 and BL3 and a common source line CSL. Each of the memory cell strings NS11 to NS33 may include a string selection transistor SST, a plurality of memory cells MC1 to MC8, and a ground selection transistor GST.

In FIG. 3, each of the memory cell strings NS11 to NS33 is illustrated to include eight memory cells MC1 to MC8. However, example embodiments are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word lines WL1 to WL8, respectively. The ground selection transistor GST may be connected to corresponding ground selection lines GSL1 to GSL3. The string selection transistor SST may be connected to corresponding bit lines BL1, BL2 and BL3, and the ground selection transistor GST may be connected to the common source line CSL.

Word lines (e.g., WL1) having the same height may be commonly connected, and the ground selection lines GSL1 to GSL3 and the string selection lines SSL1 to SSL3 may be separated.

In FIG. 3, the memory cell array 110 is illustrated to be coupled to eight word lines WL1 to WL8 and three bit lines BL1 to BL3. However, example embodiments are not limited thereto. In some example embodiments, the memory cell array 110 may be coupled to any number of world lines and bit lines.

Referring again to FIG. 2, the control circuit 160 may receive the command signal CMD, the address signal ADDR, and the clock signal CLK from the memory controller 200, and control a program operation, a read operation, and an erase operation of the nonvolatile memory device 100 based on the command signal CMD and the address signal ADDR in synchronization with the clock signal CLK.

For example, the control circuit 160 may generate control signals CONs, which are used for controlling the voltage generator 150, based on the command signal CMD, and generate a row address R_ADDR and a column address C_ADDR based on the address signal ADDR. The control circuit 160 may provide the row address R_ADDR to the address decoder 120 and provide the column address C_ADDR to the data input/output circuit 140.

The address decoder 120 may be coupled to the memory cell array 110 through the string selection line SSL, the plurality of word lines WLs, and the ground selection line GSL.

During the program operation or the read operation, the address decoder 120 may determine one of the plurality of word lines WLs as a selected word line and determine rest of the plurality of word lines WLs except for the selected word line as unselected word lines based on the row address R_ADDR.

The voltage generator 150 may generate word line voltages VWLs, which are required for the operation of the nonvolatile memory device 100, based on the control signals CONs. The word line voltages VWLs may be applied to the plurality of word lines WLs through the address decoder 120.

For example, during the program operation, the voltage generator 150 may generate a program voltage and a program pass voltage. The program voltage may be applied to the selected word line through the address decoder 120, and the program pass voltage may be applied to the unselected word lines through the address decoder 120.

In addition, during the read operation, the voltage generator 150 may generate a read voltage and a read pass voltage. The read voltage may be applied to the selected word line through the address decoder 120, and the read pass voltage may be applied to the unselected word lines through the address decoder 120.

The page buffer circuit 130 may be coupled to the memory cell array 110 through the plurality of bit lines BLs.

The page buffer circuit 130 may include a plurality of page buffers. In some example embodiments, one page buffer may be connected to one bit line. In other example embodiments, one page buffer may be connected to two or more bit lines.

The page buffer circuit 130 may temporarily store data to be programmed in a selected page or data read out from the selected page.

The data input/output circuit 140 may be coupled to the page buffer circuit 130 through data lines DL.

During the program operation, the data input/output circuit 140 may receive the data DT from the memory controller 200 and provide the data DT to the page buffer circuit 130 based on the column address C_ADDR received from the control circuit 160.

During the read operation, the data input/output circuit 140 may provide the data DT, which are stored in the page buffer circuit 130, to the memory controller 200 based on the column address C_ADDR received from the control circuit 160.

The temperature sensor 170 may periodically detect a current temperature C_TEMP, and provide the current temperature C_TEMP to the control circuit 160.

As illustrated in FIG. 2, the temperature sensor 170 may be located near the memory cell array 110. Therefore, the current temperature C_TEMP detected by the temperature sensor 170 may correspond to a temperature of the memory cell array 110.

The control circuit 160 may compare the current temperature C_TEMP with a reference temperature.

When the current temperature C_TEMP is lower than the reference temperature, the control circuit 160 may determine whether an external input/output command, which is provided by the memory controller 200, exists.

When the external input/output command exists, the control circuit 160 may perform an input/output operation, which corresponds to the external input/output command, on the memory cell array 110.

On the other hand, when the external input/output command does not exist, the control circuit 160 may perform a desired and/or alternatively predetermined internal input/output operation on the memory cell array 110 regardless of a command from the memory controller 200.

As described above, the nonvolatile memory device 100 may periodically detect the current temperature C_TEMP using the temperature sensor 170, and perform the input/output operation, which corresponds to a command received from the memory controller 200, or the desired and/or alternatively predetermined internal input/output operation when the current temperature C_TEMP is lower than the reference temperature.

Therefore, when the current temperature C_TEMP is lower than the reference temperature, the nonvolatile memory device 100 according to some example embodiments may rapidly increase the temperature of the memory cell array 110 above the reference temperature to limit and/or prevent the operation error.

Figure 4:
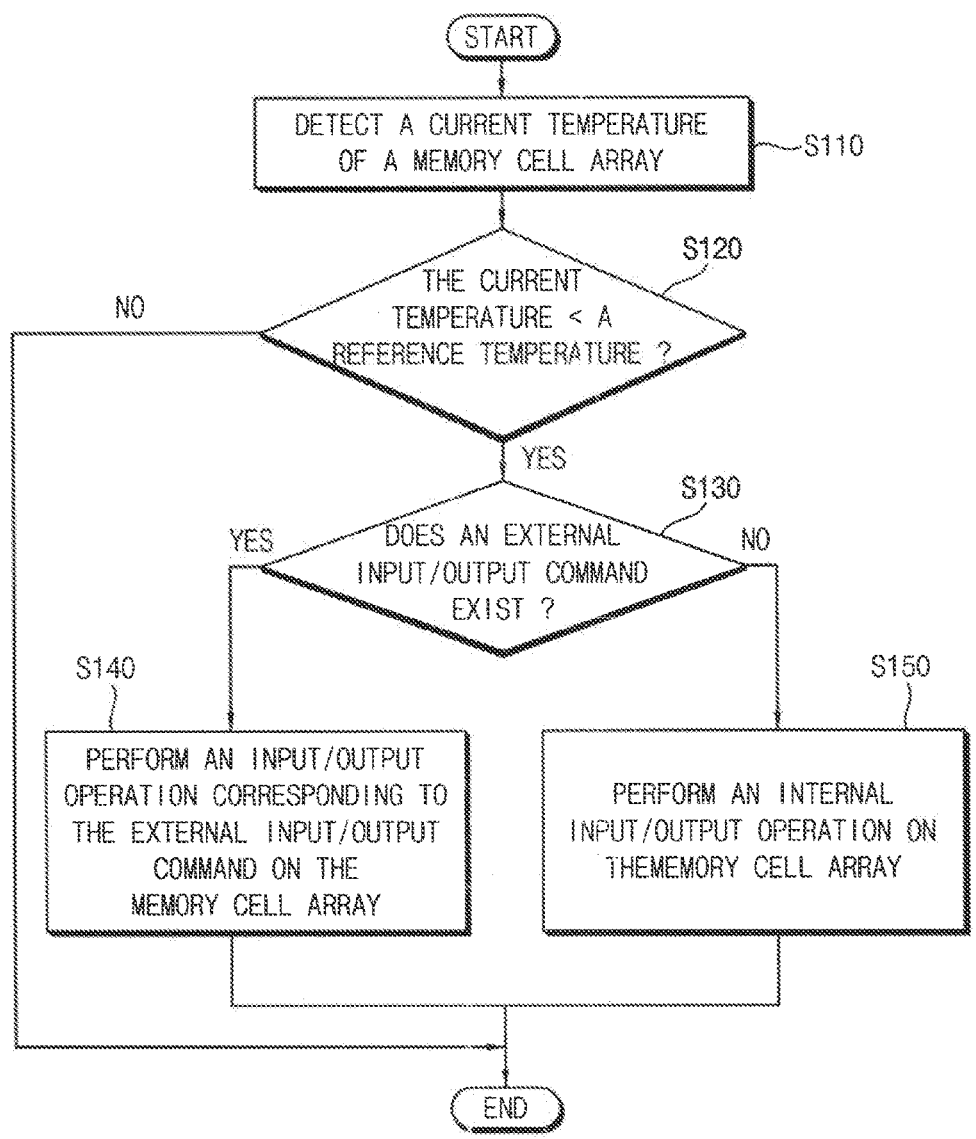
FIG. 4 is a flow chart illustrating a method of throttling temperature of a nonvolatile memory device according to some example embodiments.

FIG. 4 is a flow chart illustrating a method of throttling temperature of a nonvolatile memory device according to some example embodiments.

The method of throttling temperature of a nonvolatile memory device of FIG. 4 may be performed by the nonvolatile memory device 100 of FIG. 2.

Referring to FIGS. 1 to 4, the temperature sensor 170 may periodically detect the current temperature C_TEMP of the memory cell array 110 (operation S110).

In some example embodiments, the temperature sensor 170 may periodically detect the current temperature C_TEMP of the memory cell array 110 under a control of the control circuit 160.

The temperature sensor 170 may provide the current temperature C_TEMP to the control circuit 160.

The control circuit 160 may compare the current temperature C_TEMP with the reference temperature (operation S120).

In some example embodiments, the reference temperature may be desired and/or alternatively predetermined and pre-stored in the control circuit 160.

In other example embodiments, the reference temperature may be provided to the control circuit 160 by the memory controller 200.

When the current temperature C_TEMP is equal to or higher than the reference temperature (operation S120; no), the control circuit 160 may determine that the temperature of the memory cell array 110 is sufficiently high such that an error may not occur during the program operation or the read operation. In this case, the control circuit 160 may perform a normal operation under a control of the memory controller 200.

On the other hand, when the current temperature C_TEMP is lower than the reference temperature (operation S120; yes), the control circuit 160 may determine whether an external input/output command, which is provided by the memory controller 200, exists (operation S130).

For example, the control circuit 160 may determine whether a program command or a read command is received from the memory controller 200 based on the command signal CMD provided by the memory controller 200.

When the external input/output command exists (operation S130; yes), the control circuit 160 may perform an input/output operation, which corresponds to the external input/output command, on the memory cell array 110 (operation S140).

On the other hand, when the external input/output command does not exist (operation S130; no), the control circuit 160 may perform the desired and/or alternatively predetermined internal input/output operation on the memory cell array 110 regardless of a command from the memory controller 200 (operation S150).

Figure 5:
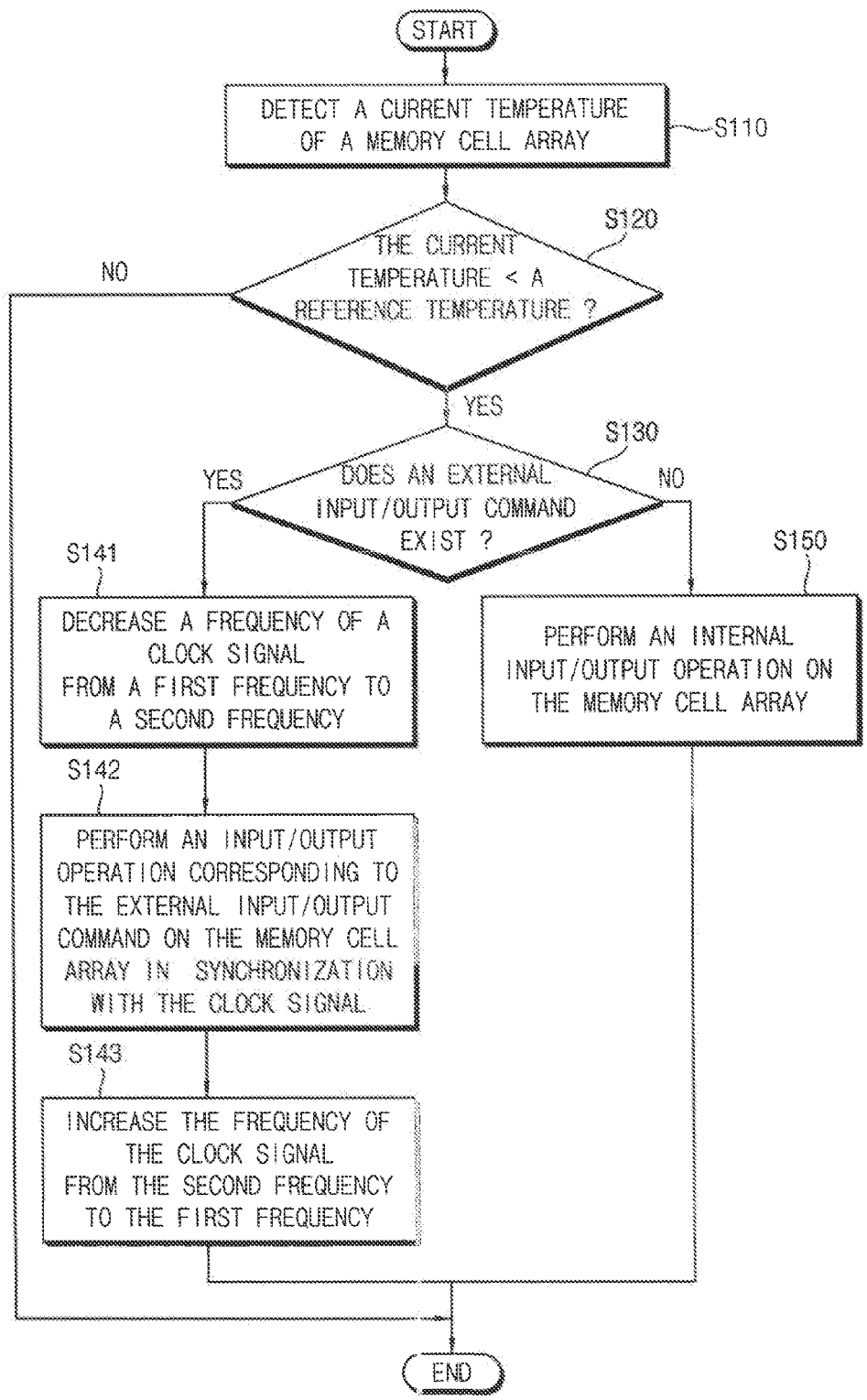
FIG. 5 is a flow chart illustrating an example of the method of throttling temperature of a nonvolatile memory device of FIG. 4.

FIG. 5 is a flow chart illustrating an example of the method of throttling temperature of a nonvolatile memory device of FIG. 4.

In FIG. 5, the process (S140) of performing the input/output operation, which corresponds to the external input/output command, on the memory cell array 110 by the control circuit 160 when the external input/output command exists is represented in detail.

Generally, when the temperature of the memory cell array 110 is low, a possibility of an operation error of the nonvolatile memory device 100 increases as an operation frequency of the nonvolatile memory device 100 increases.

Therefore, as illustrated in FIG. 5, when the external input/output command exists (operation S130; yes), the control circuit 160 may request the memory controller 200 to change a frequency of the clock signal CLK, and the memory controller 200 may decrease the frequency of the clock signal CLK from a first frequency to a second frequency (operation S141).

After that, the control circuit 160 may perform the input/output operation, which corresponds to the external input/output command, on the memory cell array 110 in synchronization with the clock signal CLK having the second frequency (operation S142).

After performing the input/output operation, which corresponds to the external input/output command, the control circuit 160 may request the memory controller 200 to change the frequency of the clock signal CLK, and the memory controller 200 may increase the frequency of the clock signal CLK from the second frequency to the first frequency (operation S143).

As described above with reference to FIG. 5, when the current temperature C_TEMP is lower than the reference temperature and the external input/output command, which is provided by the memory controller 200, exists, the memory controller 200 may temporarily decrease the frequency of the clock signal CLK, and the control circuit 160 may perform the input/output operation, which corresponds to the external input/output command, on the memory cell array 110 in synchronization with the clock signal CLK having the decreased frequency.

As such, the temperature of the memory cell array 110 may be rapidly increased to limit and/or prevent the operation error of the nonvolatile memory device 100.

Figure 6:
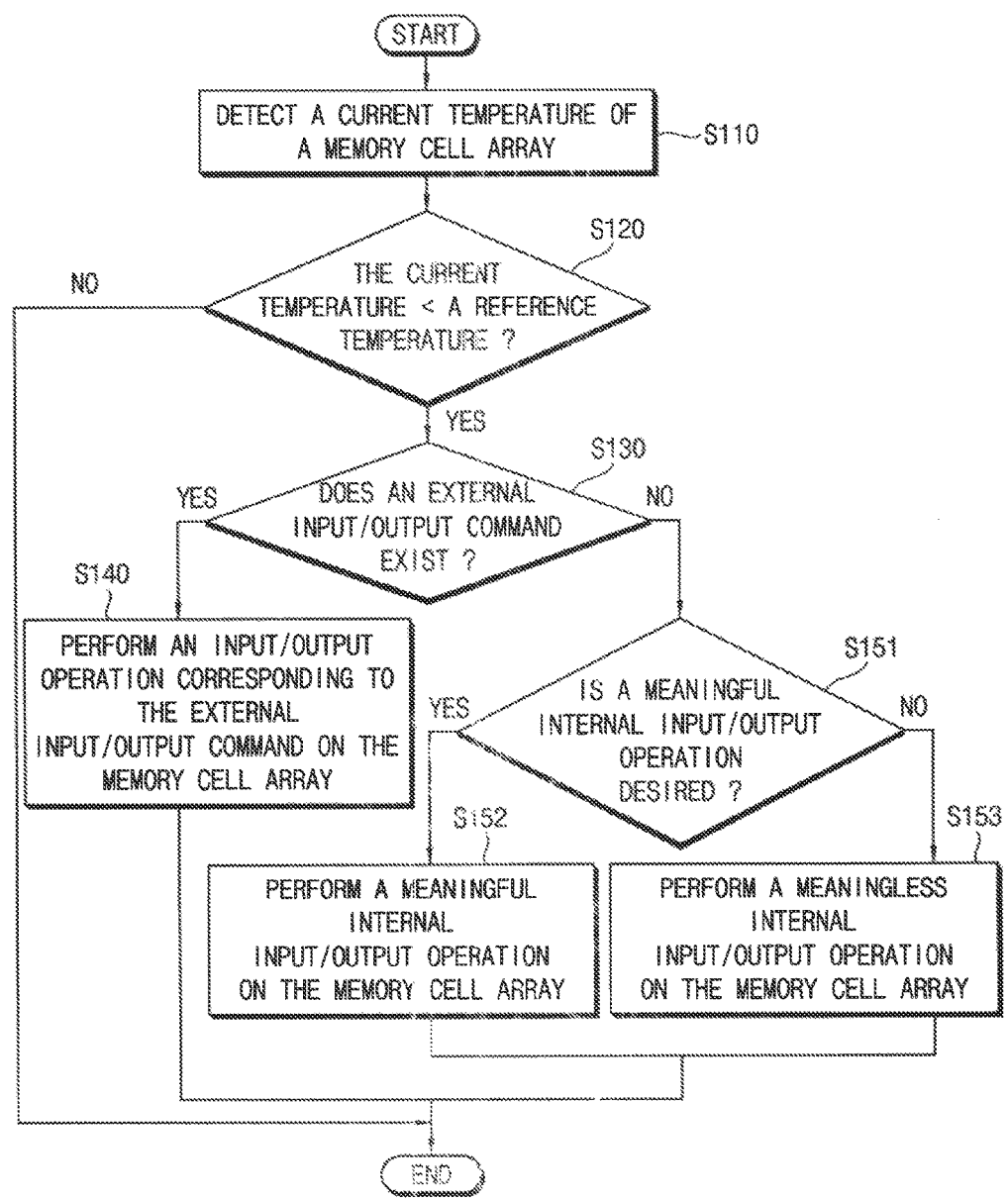
FIG. 6 is a flow chart illustrating another example of the method of throttling temperature of a nonvolatile memory device of FIG. 4.

FIG. 6 is a flow chart illustrating another example of the method of throttling temperature of a nonvolatile memory device of FIG. 4.

In FIG. 6, the process (S150) of performing the desired and/or alternatively predetermined internal input/output operation on the memory cell array 110 by the control circuit 160 when the external input/output command does not exist is represented in detail.

In some example embodiments, the internal input/output operation may include a meaningful internal input/output operation, which causes a change of a physical area of the memory cell array 110 in which the data DT provided by the memory controller 200 is stored, and a meaningless internal input/output operation, which does not cause a change of the physical area of the memory cell array 110 in which the data DT provided by the memory controller 200 is stored.

The meaningful internal input/output operation may include a wear leveling operation performed on the memory cell array 110, a garbage collection operation performed on the memory cell array 110, and a bad block management operation, which manages a mapping table to limit and/or prevent data from being stored on a bad block among a plurality of blocks of the memory cell array 110.

Referring to FIG. 6, when the external input/output command does not exist (operation S130; no), the control circuit 160 may determine whether the meaningful internal input/output operation is desired (and/or required) to be performed (operation S151).

For example, when the external input/output command does not exist (operation S130; no), the control circuit 160 may determine whether at least one of the wear leveling operation, the garbage collection operation, and the bad block management operation is desired (and/or required) to be performed.

When the meaningful internal input/output operation is desired (and/or required) to be performed (operation S151; yes), the control circuit 160 may perform the meaningful internal input/output operation on the memory cell array 110 (operation S152).

Figure 7:
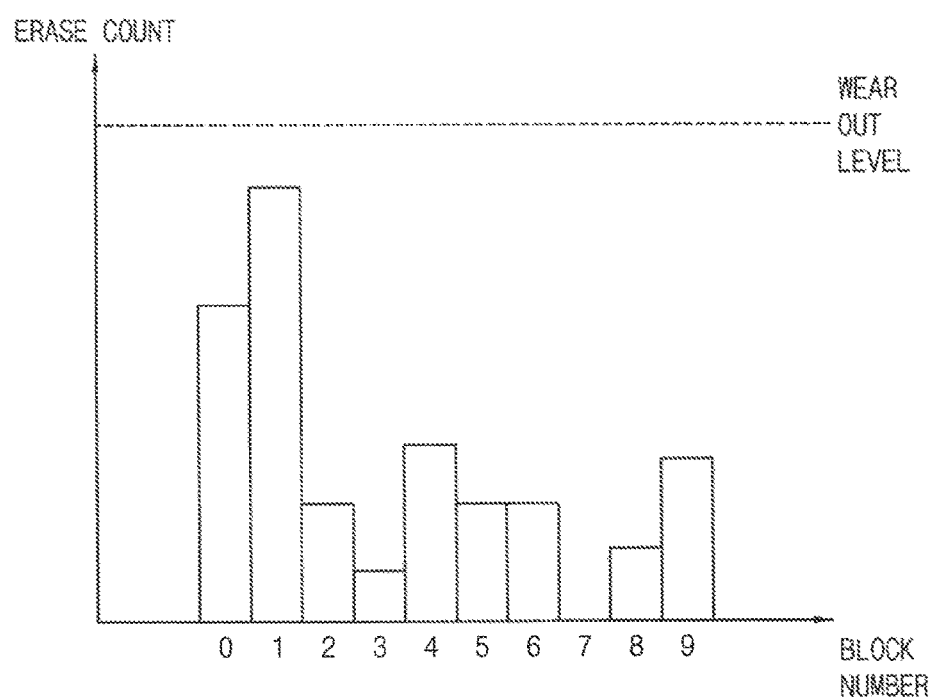
FIG. 7 is a diagram for describing a wear leveling operation performed by the nonvolatile memory device of FIG. 2.

FIG. 7 is a diagram for describing a wear leveling operation performed by the nonvolatile memory device of FIG. 2.

In FIG. 7, x-axis represents numbers of the plurality of blocks included in the memory cell array 110, and y-axis represents an erase count, which indicates a number of the erase operation performed on each of the plurality of blocks included in the memory cell array 110.

The erase operation may be performed on the memory cell array 110 in a unit of a block. When the erase count of a block exceeds a wear out level, a possibility of an error occurring while the program operation or the read operation is performed on the block may increase. Therefore, when the erase count of a block exceeds a wear out level, the block may be regarded as a bad block such that the block may not be used.

As illustrated in FIG. 7, when the erase counts of some blocks are relatively high compared to the erase counts of other blocks, the nonvolatile memory device 100 may move the data DT stored in a block having a relatively high erase count to a block having a relatively low erase count to increase a life time of the nonvolatile memory device 100.

In this way, an operation of moving the data DT stored in a block having a relatively high erase count to a block having a relatively low erase count may be referred to as the wear leveling operation.

Referring again to FIG. 6, in some example embodiments, when the external input/output command does not exist (operation S130; no), the control circuit 160 may determine whether the wear leveling operation is desired (and/or required) to be performed (operation S151). When the wear leveling operation is desired (and/or required) to be performed (operation S151; yes), the control circuit 160 may perform the wear leveling operation on the memory cell array 110 (operation S152).

As described above, when the current temperature C_TEMP is lower than the reference temperature and the external input/output command, which is provided by the memory controller 200, does not exist, the nonvolatile memory device 100 may perform the wear leveling operation such that the temperature of the memory cell array 110 may be rapidly increased while the life time of the nonvolatile memory device 100 may be effectively increased.

Figure 8:
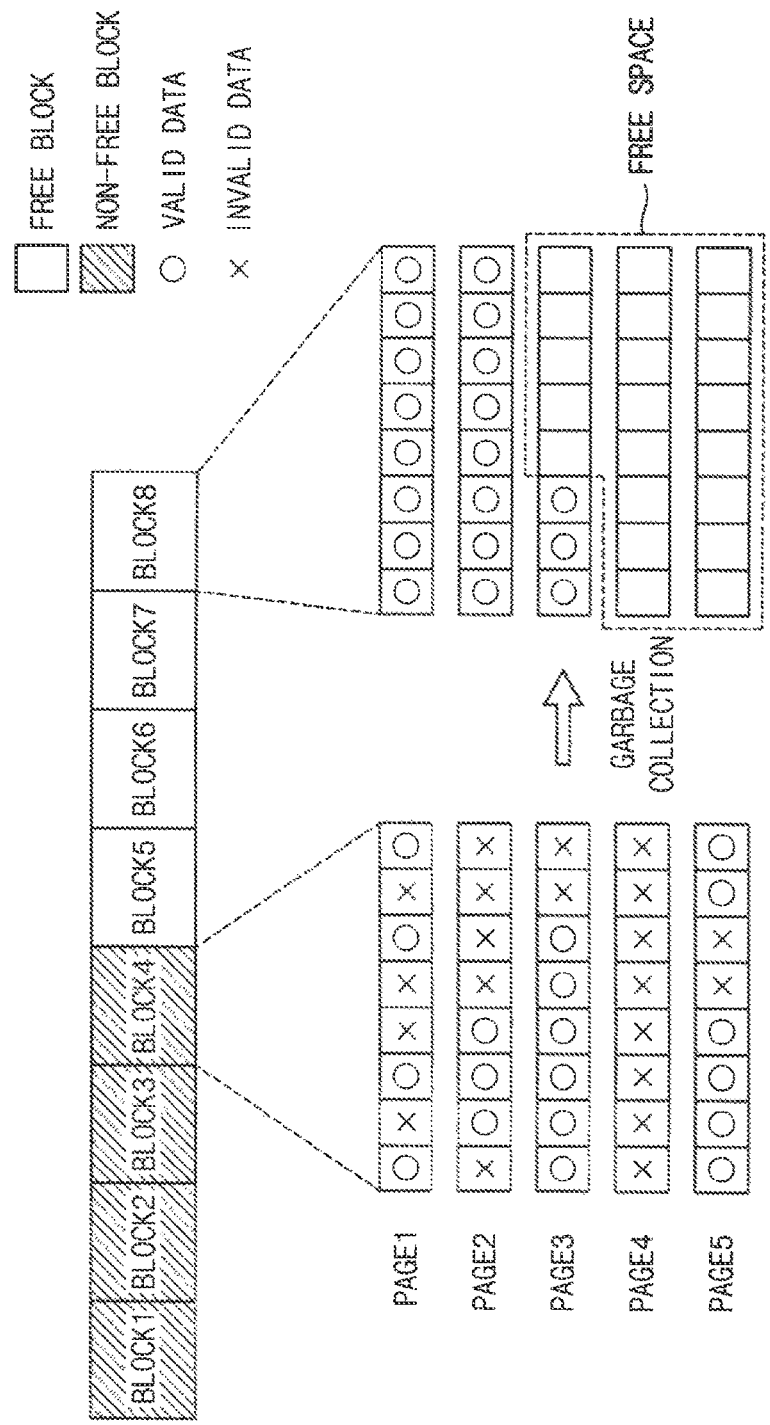
FIG. 8 is a diagram for describing a garbage collection operation performed by the nonvolatile memory device of FIG. 2.

FIG. 8 is a diagram for describing a garbage collection operation performed by the nonvolatile memory device of FIG. 2.

In FIG. 8, the memory cell array 110 includes first through eighth blocks BLOCK1, BLOCK2, BLOCK3, BLOCK4, BLOCK5, BLOCK6, BLOCK7, and BLOCK8, and each of the first through eighth blocks BLOCK1, BLOCK2, BLOCK3, BLOCK4, BLOCK5, BLOCK6, BLOCK7, and BLOCK8 includes first through fifth pages PAGE1, PAGE2, PAGE3, PAGE4, and PAGE5 as an example.

Referring to FIG. 8, data may be stored in the first through fourth blocks BLOCK1, BLOCK2, BLOCK3, and BLOCK4, and the fifth through eighths blocks BLOCK5, BLOCK6, BLOCK7, and BLOCK8 may be free blocks in which data are not stored.

As illustrated in FIG. 8, both valid data and invalid data may be stored in the first through fifth pages PAGE1, PAGE2, PAGE3, PAGE4, and PAGE5 of the fourth block BLOCK4.

In this case, the nonvolatile memory device 100 may move the valid data stored in the fourth block BLOCK4 to one of the free blocks BLOCK8, and then erase the fourth block BLOCK4. Therefore, the fourth block BLOCK4 may be changed to the free block. In addition, a space of the eighth block BLOCK8, which is remained after the valid data are moved from the fourth block BLOCK4 to the eighth block BLOCK8, may be a free space.

In this way, an operation of moving the valid data stored in a non-free block, which stores both the valid data and the invalid data, to the free block, and erasing the non-free block may be referred to as the garbage collection operation.

Referring again to FIG. 6, in some example embodiments, when the external input/output command does not exist (operation S130; no), the control circuit 160 may determine whether the garbage collection operation is desired (and/or required) to be performed (operation S151). When the garbage collection operation is desired (and/or required) to be performed (operation S151; yes), the control circuit 160 may perform the garbage collection operation on the memory cell array 110 (operation S152).

As described above, when the current temperature C_TEMP is lower than the reference temperature and the external input/output command, which is provided by the memory controller 200, does not exist, the nonvolatile memory device 100 may perform the garbage collection operation such that the temperature of the memory cell array 110 may be rapidly increased while the performance of the nonvolatile memory device 100 may be effectively increased.

Figure 9:
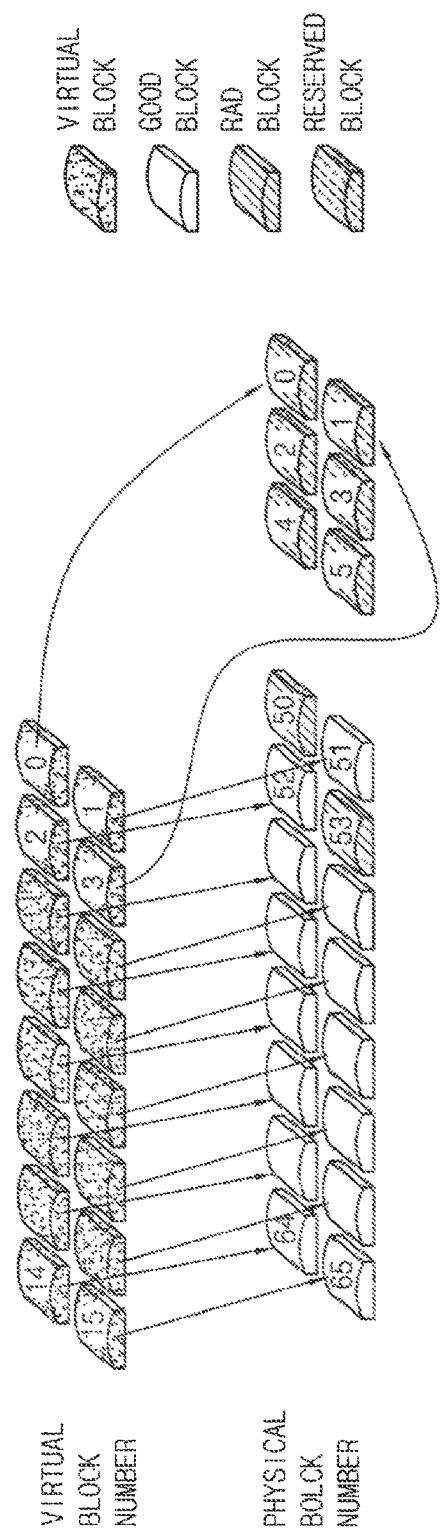
FIG. 9 is a diagram for describing a bad block management operation performed by the nonvolatile memory device of FIG. 2.

FIG. 9 is a diagram for describing a bad block management operation performed by the nonvolatile memory device of FIG. 2.

As illustrated in FIG. 9, the nonvolatile memory device 100 may map virtual blocks to physical blocks of the memory cell array 110 using a mapping table.

Some blocks among the plurality of blocks included in the memory cell array 110 may be determined as the bad block during the manufacturing process of the nonvolatile memory device 100, or become the bad block during the use of the nonvolatile memory device 100. In this case, as illustrated in FIG. 9, to limit and/or prevent the data DT from being stored in the bad block, the nonvolatile memory device 100 may change the mapping table such that the virtual block is mapped to a reserved block instead of the bad block.

In this way, an operation of managing the mapping table to limit and/or prevent the data DT from being stored in the bad block may be referred to as the bad block management operation.

Referring again to FIG. 6, in some example embodiments, when the external input/output command does not exist (operation S130; no), the control circuit 160 may determine whether the bad block management operation is desired (and/or required) to be performed (operation S151). When the bad block management operation is desired (and/or required) to be performed (operation S151; yes), the control circuit 160 may perform the bad block management operation (operation S152).

As described above, when the current temperature C_TEMP is lower than the reference temperature and the external input/output command, which is provided by the memory controller 200, does not exist, the nonvolatile memory device 100 may perform the bad block management operation such that the temperature of the memory cell array 110 may be rapidly increased while an occurrence of an error in the nonvolatile memory device 100 may be effectively limited and/or prevented.

In some example embodiments, when the nonvolatile memory device 100 corresponds to a universal flash storage (UFS) device, the control circuit 160 may inform the memory controller 200 that the meaningful internal input/output operation is being performed as a background operation through UPIU (UFS Protocol Information Unit) while the control circuit 160 performs the meaningful internal input/output operation on the memory cell array 110.

In this case, the memory controller 200 may not provide a non-urgent command to the nonvolatile memory device 100 until the nonvolatile memory device 100 finishes performing the meaningful internal input/output operation. After the nonvolatile memory device 100 finishes performing the meaningful internal input/output operation, the memory controller 200 may provide the non-urgent command to the nonvolatile memory device 100.

On the other hand, the memory controller 200 may provide an urgent command to the nonvolatile memory device 100 immediately although the nonvolatile memory device 100 performs the meaningful internal input/output operation.

Referring again to FIG. 6, when the meaningful internal input/output operation is not required to be performed (operation S151; no), the control circuit 160 may perform the meaningless internal input/output operation on the memory cell array 110 (operation S153).

In some example embodiments, when the meaningful internal input/output operation is not required to be performed (operation S151; no), the control circuit 160 may perform a repeated read operation, which corresponds to consecutive read operations performed on a plurality of pages of the memory cell array 110 (operation S153).

Since the repeated read operation is performed only to increase the temperature of the memory cell array 110, the data DT read from the memory cell array 110 through the repeated read operation may not be provided to the memory controller 200.

In this way, the temperature of the memory cell array 110 may be increased rapidly by performing the repeated read operation.

In other example embodiments, when the meaningful internal input/output operation is not required to be performed (operation S151; no), the control circuit 160 may perform a repeated program operation, which corresponds to consecutive program operations performed on vacant pages among a plurality of pages of the memory cell array 110 (operation S153).

For example, the control circuit 160 may program a value of "0" in all of memory cells included in the vacant pages through the repeated program operation. Alternatively, the control circuit 160 may program a value of "1" in all of memory cells included in the vacant pages through the repeated program operation.

In this way, the temperature of the memory cell array 110 may be increased rapidly by performing the repeated program operation.

Figure 10:
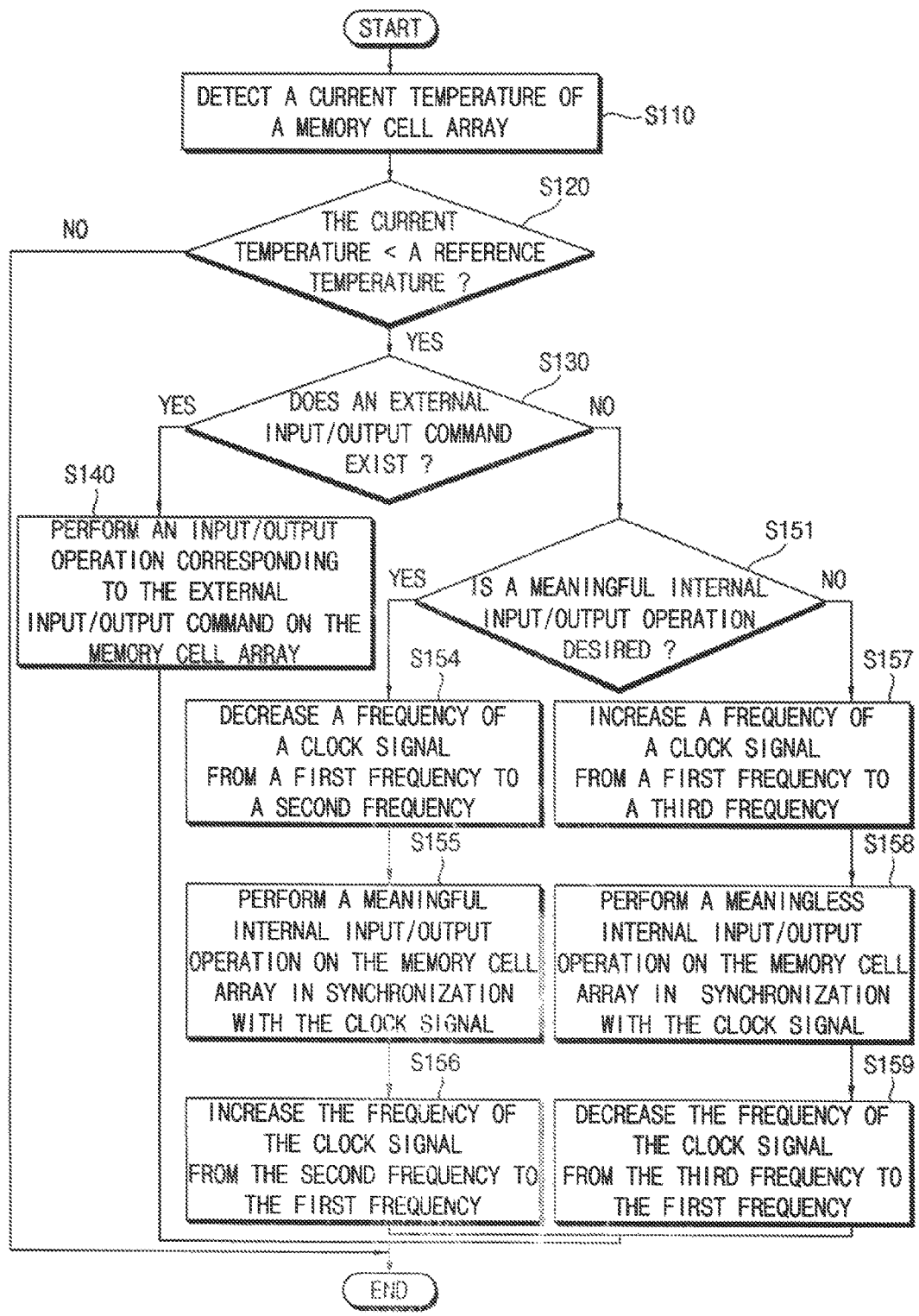
FIG. 10 is a flow chart illustrating an example of the method of throttling temperature of a nonvolatile memory device of FIG. 6.

FIG. 10 is a flow chart illustrating an example of the method of throttling temperature of a nonvolatile memory device of FIG. 6.

In FIG. 10, the process (S152) of performing the meaningful internal input/output operation on the memory cell array 110 and the process (S153) of performing the meaningless internal input/output operation on the memory cell array 110 by the control circuit 160 when the external input/output command does not exist is represented in detail.

Generally, when the temperature of the memory cell array 110 is low, a possibility of an operation error of the nonvolatile memory device 100 increases as an operation frequency of the nonvolatile memory device 100 increases. A meaningful internal input/output operation may be desired if the temperature of the memory cell array 110 is less than a threshold value.

Therefore, as illustrated in FIG. 10, when the meaningful internal input/output operation is desired (and/or required) to be performed (operation S151; yes), the control circuit 160 may request the memory controller 200 to change the frequency of the clock signal CLK, and the memory controller 200 may decrease the frequency of the clock signal CLK from a first frequency to a second frequency (operation S154).

After that, the control circuit 160 may perform the meaningful internal input/output operation on the memory cell array 110 in synchronization with the clock signal CLK having the second frequency (operation S155).

After performing the meaningful internal input/output operation, the control circuit 160 may request the memory controller 200 to change the frequency of the clock signal CLK, and the memory controller 200 may increase the frequency of the clock signal CLK from the second frequency to the first frequency (operation S156).

The temperature of the memory cell array 110 may be increased rapidly as the operation frequency of the nonvolatile memory device 100 increases.

Therefore, as illustrated in FIG. 10, when the meaningful internal input/output operation is not required to be performed (operation S151; no), the control circuit 160 may request the memory controller 200 to change the frequency of the clock signal CLK, and the memory controller 200 may increase the frequency of the clock signal CLK from a first frequency to a third frequency (operation S157).

After that, the control circuit 160 may perform the meaningless internal input/output operation on the memory cell array 110 in synchronization with the clock signal CLK having the third frequency (operation S158).

After performing the meaningless internal input/output operation, the control circuit 160 may request the memory controller 200 to change the frequency of the clock signal CLK, and the memory controller 200 may decrease the frequency of the clock signal CLK from the third frequency to the first frequency (operation S159).

As described above with reference to FIG. 10, when the meaningful internal input/output operation is desired (and/or required) to be performed (operation S151; yes), the memory controller 200 may temporarily decrease the frequency of the clock signal CLK, and the control circuit 160 may perform the meaningful internal input/output operation on the memory cell array 110 in synchronization with the clock signal CLK having the decreased frequency.

As such, the temperature of the memory cell array 110 may be rapidly increased to limit and/or prevent the operation error of the nonvolatile memory device 100.

On the other hand, when the meaningful internal input/output operation is not required to be performed (operation S151; no), the memory controller 200 may temporarily increase the frequency of the clock signal CLK, and the control circuit 160 may perform the meaningless internal input/output operation on the memory cell array 110 in synchronization with the clock signal CLK having the increased frequency.

As such, the temperature of the memory cell array 110 may be increased more rapidly.

Figure 11:
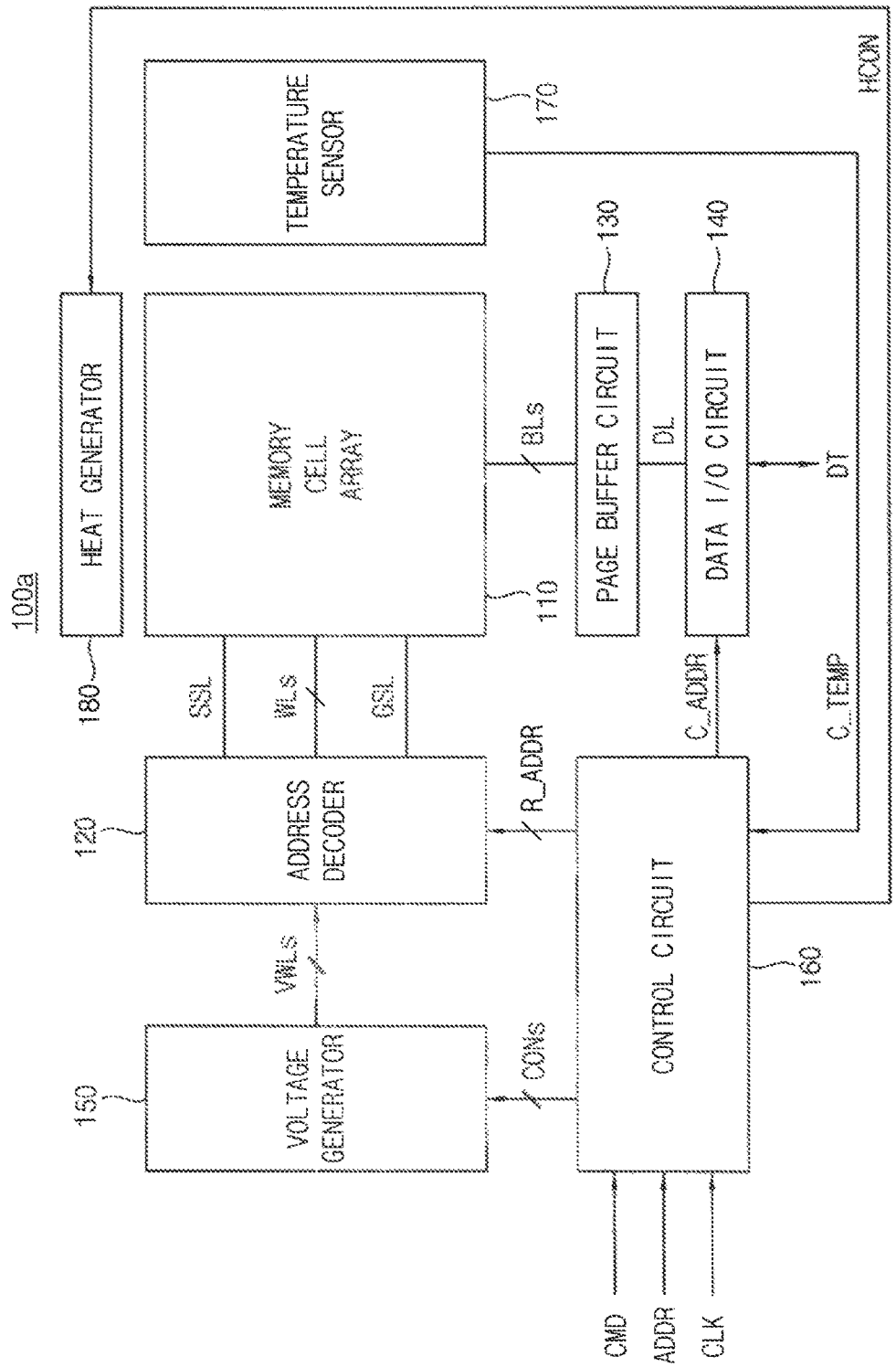
FIG. 11 is a block diagram illustrating another example of a nonvolatile memory device included in the electronic system of FIG. 1.

FIG. 11 is a block diagram illustrating another example of a nonvolatile memory device included in the electronic system of FIG. 1.

Referring to FIG. 11, the nonvolatile memory device 100*a* may include a memory cell array 110, an address decoder 120, a page buffer circuit 130, a data input/output circuit 140, a voltage generator 150, a control circuit 160, a temperature sensor 170, and a heat generator 180.

The nonvolatile memory device 100*a* of FIG. 11 is the same as the nonvolatile memory device 100 of FIG. 2 except that the nonvolatile memory device 100*a* of FIG. 11 further includes the heat generator 180.

The heat generator 180 may be turned on in response to a heat control signal HCON received from the control circuit 160 to generate heat.

The heat generator 180 may be implemented in various structures.

As illustrated in FIG. 11, the heat generator 180 may be located near the memory cell array 110. Therefore, when the heat generator 180 is turned on, the temperature of the memory cell array 110 may be rapidly increased.

Figure 12:
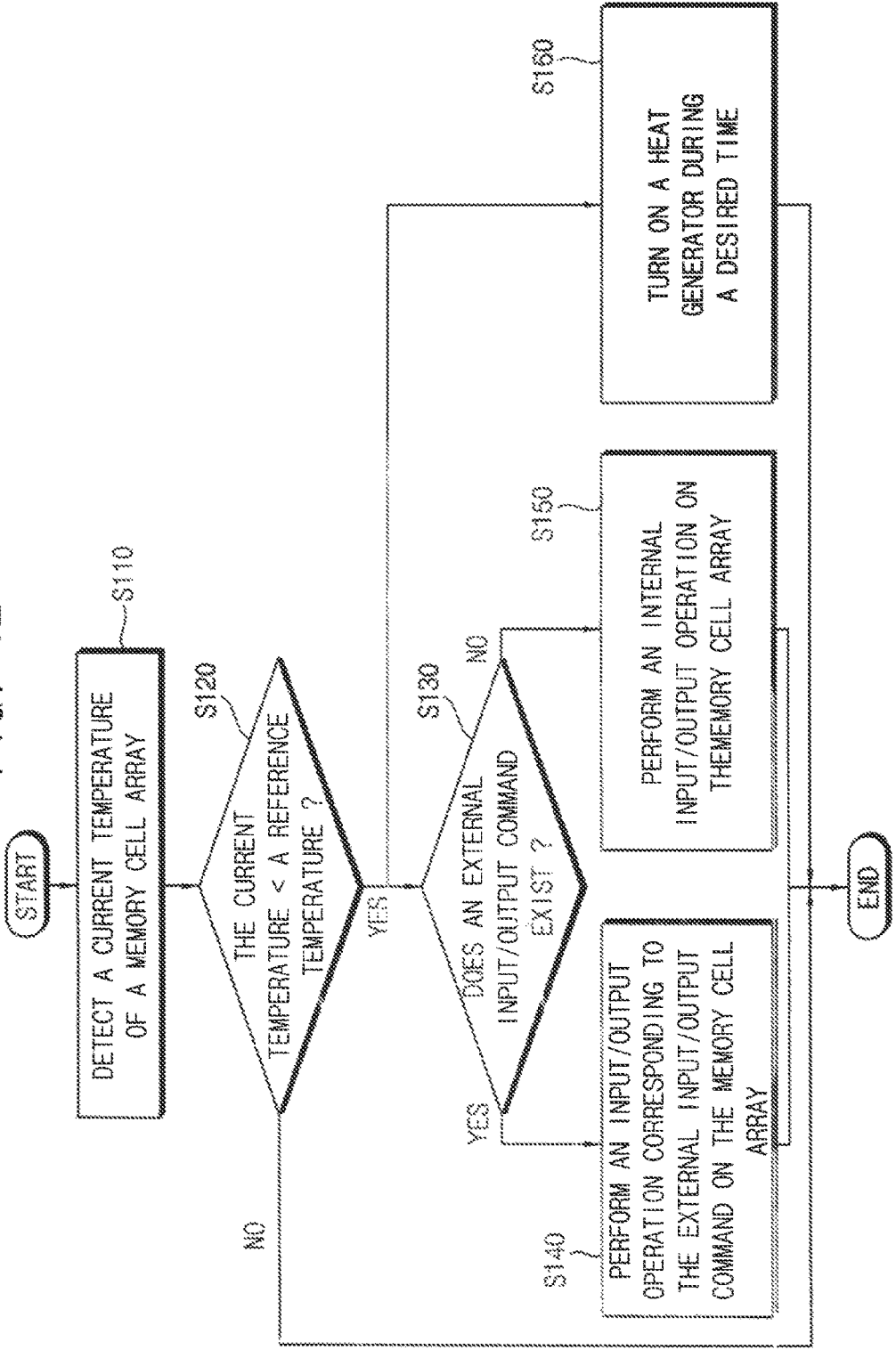
FIG. 12 is a flow chart illustrating a method of throttling temperature of a nonvolatile memory device according to some example embodiments.

FIG. 12 is a flow chart illustrating a method of throttling temperature of a nonvolatile memory device according to some example embodiments.

The method of throttling temperature of a nonvolatile memory device of FIG. 12 may be performed by the nonvolatile memory device 100*a* of FIG. 11.

Referring to FIGS. 1 to 12, the temperature sensor 170 may periodically detect the current temperature C_TEMP of the memory cell array 110 (operation S110).

In some example embodiments, the temperature sensor 170 may periodically detect the current temperature C_TEMP of the memory cell array 110 under a control of the control circuit 160.

The temperature sensor 170 may provide the current temperature C_TEMP to the control circuit 160.

The control circuit 160 may compare the current temperature C_TEMP with the reference temperature (operation S120).

In some example embodiments, the reference temperature may be desired and/or alternatively predetermined and pre-stored in the control circuit 160.

In other example embodiments, the reference temperature may be provided to the control circuit 160 by the memory controller 200.

When the current temperature C_TEMP is equal to or higher than the reference temperature (operation S120; no), the control circuit 160 may determine that the temperature of the memory cell array 110 is sufficiently high such that an error may not occur during the program operation or the read operation. In this case, the control circuit 160 may perform a normal operation under a control of the memory controller 200.

On the other hand, when the current temperature C_TEMP is lower than the reference temperature (operation S120; yes), the control circuit 160 may determine whether an external input/output command, which is provided by the memory controller 200, exists (operation S130).

For example, the control circuit 160 may determine whether a program command or a read command is received from the memory controller 200 based on the command signal CMD provided by the memory controller 200.

When the external input/output command exists (operation S130; yes), the control circuit 160 may perform an input/output operation, which corresponds to the external input/output command, on the memory cell array 110 (operation S140).

On the other hand, when the external input/output command does not exist (operation S130; no), the control circuit 160 may perform the desired and/or alternatively predetermined internal input/output operation on the memory cell array 110 regardless of a command from the memory controller 200 (operation S150).

As illustrated in FIG. 12, when the current temperature C_TEMP is lower than the reference temperature (operation S120; yes), the control circuit 160 may turn on the heat generator 180 during a desired and/or alternatively predetermined time while the control circuit 160 performs an input/output operation, which corresponds to the external input/output command, or the desired and/or alternatively predetermined internal input/output operation on the memory cell array 110 (operation S160).

Therefore, when the current temperature C_TEMP is lower than the reference temperature, the nonvolatile memory device 100 may increase the temperature of the memory cell array 110 more rapidly by turning on the heat generator 180 during the desired and/or alternatively predetermined time.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of throttling temperature of a nonvolatile memory device including a memory cell array, the method comprising:
    detecting a current temperature of the nonvolatile memory device periodically;
    determining whether an external input/output command exists,
        the external input/output command being provided by a memory controller,
        the determining whether the external input/output command exists being performed in response to the current temperature being lower than a reference temperature;
    performing an input/output operation, which corresponds to the external input/output command, on the memory cell array in response to determining the external input/output command exists and determining the current temperature is lower than the reference temperature, the performing the input/output operation increasing the current temperature of the nonvolatile memory device; and
    performing an internal input/output operation on the memory cell array regardless of a command from the memory controller in response to determining the external input/output command does not exist and the current temperature being lower than the reference temperature,
    wherein the performing the internal input/output operation on the memory cell array includes,
        determining whether a meaningful internal input/output operation, which causes a change of a physical area of the memory cell array on which data provided by the memory controller is stored, is desired,
        performing the meaningful internal input/output operation when the meaningful internal input/output operation is desired, and
        performing a meaningless internal input/output operation, which does not cause a change of the physical area of the memory cell array on which the data provided by the memory controller is stored, when the meaningful internal input/output operation is not desired to be performed.

2. The method of claim 1, wherein the performing the internal input/output operation includes performing a wear leveling operation on the memory cell array.

3. The method of claim 1, wherein the performing the internal input/output operation includes performing a garbage collection operation on the memory cell array.

4. The method of claim 1, wherein
    the performing the internal input/output operation includes performing a bad block management operation on the memory cell array,
and
    the bad block management operation manages a mapping table to limit data from being stored on a bad block among a plurality of blocks of the memory cell array.

5. The method of claim 1, wherein
    the performing the internal input/output operation includes performing a repeated read operation, and
    the repeated read operation corresponds to consecutive read operations performed on a plurality of pages of the memory cell array.

6. The method of claim 1, wherein
    the performing the internal input/output operation includes performing a repeated program operation, and
    the repeated program operation corresponds to consecutive program operations performed on vacant pages among a plurality of pages in the memory cell array.

7. The method of claim 6, wherein
    the memory cell array includes memory cells,
and
    the repeated program operation corresponds to programming a value of "0" in all of the memory cells included in the vacant pages.

8. The method of claim 6, wherein
    the memory cell array includes memory cells, and
    the repeated program operation corresponds to programming a value of "1" in all of the memory cells included in the vacant pages.

9. The method of claim 1, wherein the performing the input/output operation, which corresponds to the external input/output command, on the memory cell array in response to determining the external input/output command exists includes:
    decreasing a frequency of a clock signal from a first frequency to a second frequency;
    performing the input/output operation, which corresponds to the external input/output command, on the memory cell array in synchronization with the clock signal; and
    increasing the frequency of the clock signal from the second frequency to the first frequency.

10. The method of claim 1, wherein the performing the meaningful internal input/output operation includes:
    decreasing a frequency of a clock signal from a first frequency to a second frequency;
    performing the meaningful internal input/output operation in synchronization with the clock signal; and
    increasing the frequency of the clock signal from the second frequency to the first frequency.

11. The method of claim 1, wherein the performing the meaningless internal input/output operation includes:
    increasing a frequency of a clock signal from a first frequency to a third frequency;
    performing the meaningless internal input/output operation in synchronization with the clock signal; and
    decreasing the frequency of the clock signal from the third frequency to the first frequency.

12. The method of claim 1, further comprising:
    turning on a heat generator included in the nonvolatile memory device during a time when the current temperature is lower than the reference temperature.

13. A nonvolatile memory device, comprising:
a memory cell array including a plurality of memory cells;
a temperature sensor configured to detect a current temperature of the memory cell array; and
a control circuit connected to the memory cell array,
the control circuit being configured to determine whether an external input/output command, which is provided by a memory controller, exists when the current temperature is lower than a reference temperature,
the control circuit being configured to perform an input/output operation, which corresponds to the external input/output command, on the memory cell array when the external input/output command exists and the current temperature is lower than the reference temperature, the input/output operation increasing the current temperature of the nonvolatile memory device, and
perform an internal input/output operation on the memory cell array regardless of a command from the memory controller when the external input/output command does not exist and the current temperature is lower than the reference temperature wherein
the control circuit is configured to perform the internal input/output operation on the memory cell array by,
determining whether a meaningful internal input/output operation, which causes a change of a physical area of the memory cell array on which data provided by the control circuit is stored, is desired,
performing the meaningful internal input/output operation when the meaningful internal input/output operation is desired, and
performing a meaningless internal input/output operation, which does not cause a change of the physical area of the memory cell array on which the data provided by the control circuit is stored, when the meaningful internal input/output operation is not desired to be performed.

14. A method of throttling temperature of a nonvolatile memory device including a memory cell array, the method comprising:
detecting a current temperature of the nonvolatile memory device;
determining whether a memory controller provided an external input/output command to the nonvolatile memory device when the current temperature is lower than or equal to a reference temperature;
performing an input/output operation of a first type on the nonvolatile memory device in response to the current temperature being lower than or equal to the reference temperature and the memory controller provided the external input/output command to the nonvolatile memory device when the current temperature is lower than or equal to the reference temperature, the performing the input/output operation of the first type increasing the current temperature of the nonvolatile memory device,
the input/output operation of the first type being performed on the nonvolatile memory device in response to the external input/output command provided by the memory controller; and
performing an input/output operation of a second type on the nonvolatile memory device in response to the current temperature being lower than or equal to the reference temperature and the memory controller does not provide the external input/output command to the nonvolatile memory device when the current temperature is lower than or equal to the reference temperature,
the input/output operation of the second type being performed on the nonvolatile memory device regardless of a command from the memory controller, and
the input/output operation of the second type being different than the input/output operation of the first type,
wherein the performing the internal input/output operation of the second type includes,
determining whether a meaningful internal input/output operation, which causes a change of a physical area of the memory cell array on which data provided by the memory controller is stored, is desired,
performing the meaningful internal input/output operation when the meaningful internal input/output operation is desired, and
performing a meaningless internal input/output operation, which does not cause a change of the physical area of the memory cell array on which the data provided by the memory controller is stored, when the meaningful internal input/output operation is not desired to be performed.

15. The method of claim 14, wherein
the memory cell array includes memory cells arranged in memory blocks,
the performing the input/output operation of the second type includes performing one of a wear leveling operation on the memory cell array, a garbage collection operation on the memory cell array, a bad block management operation on the memory cell array, a repeated read operation, and a repeated program operation.

16. The method of claim 14, wherein the detecting the current temperature of the nonvolatile memory device includes using a temperature sensor in the nonvolatile memory device to detect the current temperature.

17. The method of claim 14, wherein the performing the input/output operation of the first type on the nonvolatile memory device includes:
decreasing a frequency of a clock signal from a first frequency to a second frequency;
performing the input/output operation, which corresponds to the external input/output command, on the nonvolatile memory device in synchronization with the clock signal; and
increasing the frequency of the clock signal from the second frequency to the first frequency.

* * * * *